United States Patent [19]

Weglin

[11] 4,447,286
[45] May 8, 1984

[54] DIE AND METHOD OF MAKING SAME

[75] Inventor: Walter Weglin, Bellevue, Wash.

[73] Assignee: Jerobee Industries, Inc., Redmond, Wash.

[21] Appl. No.: 365,368

[22] Filed: Apr. 5, 1982

[51] Int. Cl.³ .......................... C23F 1/02; B44C 1/22; C03C 15/00; C03C 25/06
[52] U.S. Cl. .................................. 156/515; 156/251; 156/651; 156/661.1; 156/905
[58] Field of Search ................. 156/651, 661.1, 905, 156/515, 251; 204/6, 17; 101/28–32, 8, 9; 428/573, 600

[56] References Cited

U.S. PATENT DOCUMENTS 2,624,700  3/1955  Morrison ..................... 430/306 X
4,102,735  7/1978  Weglin ......................... 156/661.1

Primary Examiner—William A. Powell

Attorney, Agent, or Firm—Hughes, Barnard & Cassidy

[57] ABSTRACT

A method for chemically milling an etchable workpiece by exposure thereof to an etchant in order to mill selected etchant-active areas and thereby form a plurality of raised die elements separated and bounded by a plurality of recessed cavities, which method is comprised of the steps of initially, partially etching the workpiece to form recessed die element precursors separated and bounded by recessed cavities, depositing a film of an etchant-resistant composition on the workpiece in at least selected ones of the recessed cavities, filling those selected cavities with an etchant-resistant filler and then subsequently processing the workpiece. In a highly preferred embodiment, the method comprises depositing a thin film of gold on the workpiece, removing the gold film from selected areas where active etching is to occur, and then filling the recessed cavities with an epoxy filler.

17 Claims, 8 Drawing Figures

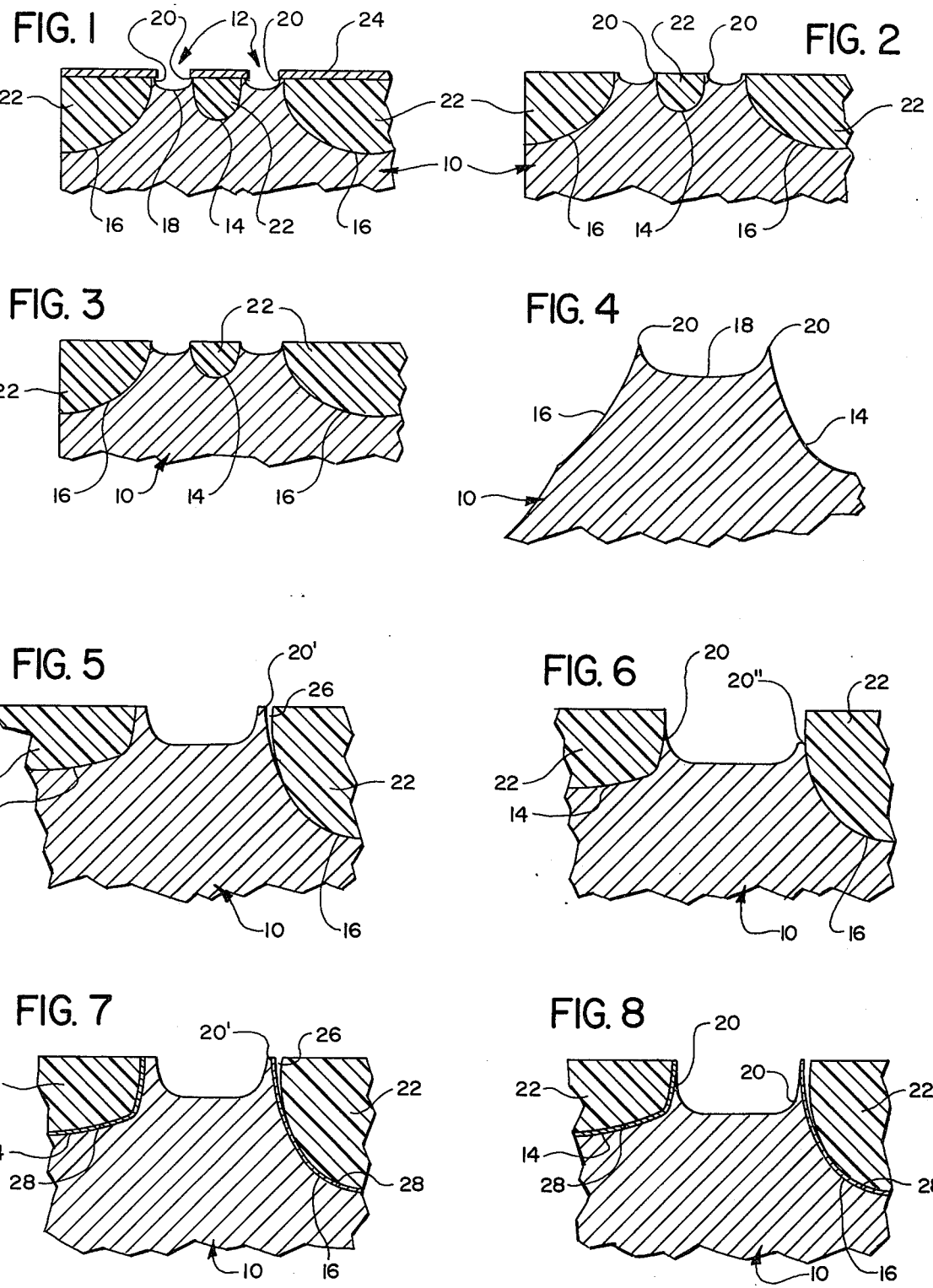

DIE AND METHOD OF MAKING SAME

CROSS REFERENCE TO RELATED PATENTS

The present invention is an improvement over the methods disclosed in the present inventor's U.S. Pats. No. 4,053,348, No. 4,102,735, No. 3,758,350, assigned to the assignee of the present invention; all of which are incorporated herein by reference and relied upon.

BACKGROUND OF THE INVENTION

1. Field of the Invention

The present invention relates, generally, to methods for forming dies by chemical milling and the resulting dies and, more especially, to methods for improving the processability of steel dies destined to be circuit stamping dies used to fabricate circuit boards.

2. Description of the Background Art and Technical Problems

The present inventor's U.S. Pat. No. 3,758,350, entitled "Method of Making a Die for Stamping Out Circuit Boards", discloses a method for etching a die block to form an improved die particularly adapted for manufacturing a relatively compact circuit board where the circuit elements are of relatively small width and with small separation therebetween. In that method, first there is formed a conventional flat face die, comprising flat face die elements with intervening recess areas, this being accomplished in a conventional manner. Then the recess areas are filled with an etchant-resistant filler such as epoxy, and a photo resist is applied over the filler in a manner to overlap the outer edge portions of the die elements so that the middle portion of each die element is etchant active. The die is then exposed to an etching medium, such as ferric chloride, to form die element recess in the middle portion of each die element with shoulders along the edge portions thereof. Next the resist material is removed and, with the filler still remaining in the recess, the die surface is again etched for a short period of time. In one procedure the final etching is done in a manner to provide "modified" die element edge portions where the inner edge surface of each die element edge portion is somewhat rounded, and in another procedure the final etching is accomplished in a manner to provide a knife edge die.

The methods disclosed in the aforementioned patent have proven quite effective in making precision dies for the stamping of circuit boards and the trimming of circuits borne on flexible substrates. Nonetheless, certain improvements over those basic techniques have been made by the present inventor, particularly relating to the manufacture of dies for stamping circuit boards from heavier foil. It has now become somewhat commonplace to use thicker foil elements in the manufacture of circuit boards to achieve, for example, the ability of the board to carry higher current loads. In turn, this has somewhat complicated the design of suitable dies for that purpose.

In a circuit board manufacturing operation it is desirable to accomplish both the forming of the circuit elements from the foil sheet and the bonding of these circuit elements to a dielectric substrate in one stamping operation. This is usually accomplished by providing a thermo-adhesive coating between the foil sheet and the substrate and heating the die prior to the stamping operation. When the heated die is brought into engagement with the foil sheet, the die elements press into the foil sheet to separate the circuit elements therefrom and press these elements into firm engagement with the substrate while heating the underlying adhesive layer to cause bonding of the circuit elements thereto. The excess foil adjacent the die elements does not become bonded to the substrate, and this excess foil is simply stripped away from the dielectric material after the stamping sequence.

When it is attempted to use heavier foils to make circuit boards where the width and spacing of the elements are quite small, the problems of accomplishing this simultaneous forming and bonding of the circuit elements properly are greatly aggravated. First, with regard to the individual die elements, the edge portions of each element must be of a height sufficient to cause a separation through the entire thickness of the foil sheet. Second, the depth of the recess area of the die must be sufficient to permit the excess foil to become positioned in the recesses during the stamping operation, without the excess foil becoming bonded to the substrate. Thus, the recessed areas of the die must have a depth sufficient to accommodate the excess foil, while the die elements must have and retain a sharp cutting profile lest a dull or rounded edge leaves a small ribbon of foil which can bridge the circuit elements to yield an undesired electrical connection. These same considerations are equally applicable to trimming dies used to trim circuits on a flexible substrate. Accordingly, it is important that the raised die elements be formed precisely to avoid this unacceptable result. It is also important to the precision of any subsequent sharpening procedure that the raised stamping element be formed precisely.

Although the goal of forming raised die elements in a very precise pattern and within carefully controlled tolerances is easily articulated, realization of that goal is sometimes quite elusive. Notwithstanding the high technological development in the art, it too often occurs that the raised elements in the die are imperfectly formed regardless of the care taken to prepare and then process the die blank. Suprisingly, a die blank believed to be of high quality steel and prepared with care will sometimes be found to have raised die elements inexplicably out of tolerance or rounded resulting in the need either to scrap the die and begin again or to undertake tedious, labor-intensive efforts to salvage that die. Considerable effort and capital resources have been expended to detect, if not understand, how and why seemingly properly prepared die blanks surprisingly run out of tolerance during intermediate fabrication techniques.

SUMMARY OF THE INVENTION

Identification Of The Threshold Problem

The methods for forming precision dies include chemical milling of a metallic die block, typically a low carbon steel or air hardening or oil hardening tool steel. The etchant most often employed is ferric chloride which will preferentially attack the exposed metal surfaces of the die block, but against which etching action the photo resist and the underlying epoxy fill remain passive. It has now been learned, however, that the epoxy fill itself (which is loaded within the cavities of a foil cutting die to support the dry film resist layers and protect the cavity side of the die during the chemical milling operation) sometimes is not perfectly adhered near the cavity edge proximate the location of a raised die element. It has also been detected that the epoxy fill sometimes will separate slightly from the metal substrate during subsequent processing; for example, due to thermal shock as the die is intermittently etched in a bath at about 100° F. and rinsed in water at about 65-70° F. In either event, this tendency toward void formation initially or during later processing will in turn tend to allow the penetration of etchant within the slight void between the epoxy within a cavity and the side of a die element, which should not be etched if optimum quality of the finished die is to be maintained. While this is a particularly vexing problem, where the die element being formed is destined to be a knife edge the problem is exacerbated due to the very small dimension of the edge itself and the preferential etchant attach which occurs along a sharp line or at a point. Thus, the ability of the etchant to remove material from both sides of a given die element edge due to the ability to penetrate within a void resulting from imperfect bonding of the epoxy likely will cause an uncontrollable etching procedure where that die element edge is out of tolerance with a corresponding edge. More often than not, the entire die must be scrapped.

Pinpointing slight separation between the epoxy (or other filler) and the cavity edge as the significant contributing factor to imperfect die edge formation was somewhat problematic. If the void is macroscopic and easily detectable, the typical remedy in the past has been to strip the fill and refill the cavity before etching. However, microscopic voids, even those imperceptible under 40X magnification, have now been appreciated by the present inventor to lead to the disasterous results noted above. That such small, unseen voids or separations could have this effect was not at all apparent in the first instance, notwithstanding the demonstrable adverse consequences.

This problem is not confined to the manufacture of circuit stamping or trimming dies, but occurs or can occur in any chemical milling operation where a polymeric fill is used as a mask and/or support for a dry film resist. It is, however, a particularly severe problem in the context of circuit board stamping dies since precisional tolerances must be maintained extremely close. Attempts to relieve uncontrollable etching due to imperfect bonding of filler materials by locating more stable filler compositions or better control in the application of the filler to the partially formed dies have not met with commercially-acceptable success. Accordingly, now that the problem has been identified, the need still exists to find a way to eliminate the problem of uncontrollable etching due to imperfect bonding of epoxy masking and/or support fills.

SUMMARY OF THE SOLUTION

The present invention advantageously provides a means for insuring a uniformity of etching action even in situations where slight voids may exist betwen the, e.g., epoxy fill and the cavity within which it is loaded. Thus, the present invention desirably permits one to achieve closely held tolerances during chemical milling procedure, which procedure is not as sensitive to the presence of inadvertent voids between the epoxy fill within a cavity and the metal substrate proximate a raised die element.

These and other advantages are achieved in a method for making a die, by chemical milling an etchable workpiece in a series of etching procedures to yield raised die elements separated and bounded by recessed cavities, wherein at least one etching sequence comprises etching a partially formed workpiece having at least selected ones of the recessed cavities provided with an underlayment film of an etchant-resistant composition beneath the etchant-resistant filler. Thus, even should there occur initial or subsequent partial separation of the fill from the metal substrate, any void thereby formed remains etchant-passive by virtue of the passive underlayment film.

In one aspect of the present invention, the method comprises the steps of initially partially etching a steel workpiece to form raised die element precursors separated and bounded by recessed cavities, depositing a film of an etchant-resistant composition on the workpiece in at least selected ones of the recessed cavities, filling the cavities wherein the film has been deposited with an etchant-resistant filler, and subsequently etching the workpiece in the normal manner. That preferred method includes depositing the film by an electro-deposition technique, and more preferably by electroplating a film selected from the group consisting of gold and platinum. Preferably, the film is applied to the entire work face of the partially formed die and is then removed from selected regions. In one variant, the metal die is plated with gold or platinum (more preferably gold) on its working face, the plated die is then surface ground to remove the film from the raised surfaces of the die, and epoxy fill is then loaded within the recessed cavities bearing the etchant-resistant film. The die is then processed in accordance with the techniques disclosed in one or more of the present inventor's U.S. Pats. No. 3,758,350, No. 4,053,348, and No. 4,102,735.

When the chemical milling procedure is completed, the epoxy or other filler is removed from the recessed cavities and the die is ready for operation. Not only is the die produced by the aforementioned preferred technique one which does not tend to suffer from uncontrollable and unwanted etching proximate the die elements, the retained gold film tends to provide a certain amount of lubricity to the die during subsequent use.

Other advantages and applications of the present invention will become apparent, and a fuller understanding gained, by reference to the following detailed description of the invention, taken in conjunction with the figures of drawing, wherein:

BRIEF DESCRIPTION OF THE DRAWINGS

FIGS. 1-3 are sectional views of a portion of a die block at various intermediate stages in the formation of raised die elements;

FIG. 4 is an enlarged sectional view of a portion of a finished die showing a completed die element;

FIG. 5 is an enlarged, fragmentary sectional view of one of the die elements shown in FIG. 2, further illustrating a situation where a void exists adjacent the die element;

FIG. 6 is an enlarged fragmentary sectional view of the die element of FIG. 5 following etching;

FIG. 7 is a view similar to FIG. 5, but showing the interposition of an etchant-resistant film underlayment below a fill in the die cavities; and, FIG. 8 is a view of the die element of FIG. 7 following a subsequent etching operation.

DETAILED DESCRIPTION OF THE INVENTION

The present invention relates, generally, to the fabrication of precision dies and, more especially, to such dies which are destined for the manufacture of circuit boards. Further along these lines, the present invention resides in part in the identification of heretofore unappreciated and undetected sources of problems in die fabricating techniques and resides in equal part in a solution therefor. Accordingly, the invention will now be described with reference to certain preferred embodiments within that context; although those skilled in the art will appreciate that such a description is meant to be exemplary only and should not be deemed limitative.

A pervasive problem in the processing of precision dies by chemical milling is the lack of control of the etching process which can occur when an etchant-resistant fill disposed within cavity to protect the same is not bonded properly to the face of that cavity. This can allow etchant to migrate within a void between the metal die block and the fill, whereby the die element being formed by the etching procedure loses its dimensional tolerance.

It can be appreciated that this problem becomes especially critical in fabricating circuit stamping dies, where it is attempted to form the edge portions of the individual die elements within quite close tolerances (e.g., on the order of one thousandth of an inch or less) so that these can properly perform their function of separating the quite small circuit elements from the foil, which circuit elements may be as small as 0.010" wide. Not only is this precision of importance in the initial formation of the die, but also with regard to future maintenance of the die. As the edge portions of the individual die elements become worn, resharpening becomes necessary and with the very small dimensions involved this resharpening can best be accomplished by means of etching. Such resharpening can only be accomplished properly if the initial formation of the die elements is within proper tolerances.

In one aspect of the present invention, the uncontrollable etching due to void formation or imperfect adherence between an epoxy fill and a cavity in a metallic die block is minimized by first applying to selected areas of the die block a film of an etchant-resistant material as an underlayment for the epoxy fill. Thus, even if etchant is able to penetrate the void, it will encounter a passive surface notwithstanding the presence of that void.

Turning to the figures of drawing, in all of which like parts are identified with like reference numerals, FIGS. 1-3 illustrate cross-sections of a die block at various stages in a chemical milling procedure to produce raised die elements which may be destined for stamping circuit boards. For the sake of brevity, reference is made to the present inventor's U.S. Pats. No. 3,758,350, No. 3,911,716, No. 4,053,348, and No. 4,102,735, for a complete discussion of the manner in which the chemical milling process is utilized for the formation of the die elements shown in these figures.

Briefly stated, a die block designated generally as 10 is formed with a plurality of raised die elements designated generally as 12, a separating cavity 14 disposed intermediate the die elements and background cavities 16 outwardly bounding the region of die elements. Each die element includes a die element recess 18 separating opposing edges or shoulders 20. This profile of die elements and cavities is preferably formed in a step-back sequence of etching—first, where the overall region of die elements is masked and the background cavities formed; second, where the individual die element regions are masked and the separating cavities formed; and, third, where the background and separating cavities are masked and the die element cavities formed. This step-back procedure is disclosed in the aforementioned patents, forms no part of the present invention, and thus further background information can be obtained by reviewing those references.

FIG. 1 illustrates a die 10 nearing the last stages of formation of die elements 12. The background and separating recesses within metal die block 10 are loaded with a filler designated generally as 22, such as an epoxy filler. The epoxy fill, which is an etchant-resistant material, serves to protect the cavities 14 and 16 during etching, while the upper surface of the fill serves to support a photo resist layer 24 used to mask selected areas of the die block during the chemical milling procedure.

The die block 10 is exposed to an etchant, such as ferric chloride, which, due to the resist layer 24 and epoxy fill 22, is capable of removal of material only from the die element cavities 18 since the remaining areas are protected by the film 24. As etching proceeds, the die element edges 20 become progressively thinner as the cavity 18 is etched toward the separating and background cavities 14 and 16, respectively. When this step has proceeded to an appropriate extent, the die is washed and the resist layer 24 is removed to yield the intermediate configuration of FIG. 2.

As can be seen in FIG. 2, the die elements 12 still retain a thickness at the upper working surface of the die where the edges 20 are being formed. When it is desired to form a knife edge element, such as the one shown in detail in FIG. 4, the die block is subjected to a further etching treatment with, e.g., ferric chloride. Again, due to the epoxy fill 22, etching proceeds within the die element cavities 18 and material is removed from the walls thereof to reduce further the transverse dimension of the die element edges 20. This reduction occurs both laterally and transversely and, upon completion, yields the die block illustrated in FIG. 3. At this stage, the etching procedure is terminated, the die is washed and cleaned thoroughly, and the epoxy fill 22 is stripped therefrom to yield a precision die having raised die elements 12 shown in enlarged view in FIG. 4.

The foregoing general description of the etching procedure is now somewhat conventional and is well disclosed in the previously mentioned United States patents. FIGS. 5 and 6 show how the presence of an imperfect bond between the epoxy fill 22 within the cavities separating a given die element can contribute to a loss of tolerance of the knife edges 20.

FIG. 5 is an enlarged view of a portion of the die shown in FIG. 2. As can be seen, the knife edges 20 have a top profile which is to be removed in a sharpening operation by etching with ferric chloride.

In the die of FIG. 5, the epoxy fill 22 in the background recess 16 is shown to be separated from the side face of the cavity proximate the die element edge 20, to yield a void or space 26 (the dimension of which is somewhat exaggerated for the sake of clarity) leading from the top surface of the die 10. Thus, when the die is exposed to etchant, that etchant may seep within the void 26 and remove the portion of die element edge 20 on the side adjacent the void 26, that edge being identified as 20'. This will yield a low, rounded, dull edge 20", as shown in FIG. 6. In turn, the die resulting from this operation will not exhibit the high precision needed for stamping, e.g., circuit boards.

FIGS. 7 and 8 parallel the die represented in FIGS. 5 and 6, respectively. However, the cavities 14 and 16 are first imparted with an underlayment of a film of an etchant-resistant composition 28. Accordingly, where an inadvertent void 26 results from an imperfect bonding of the epoxy fill or from subsequent shrinkage thereof during a cure or for any other reason, any etchant which may migrate within the void will find passive surface which may not be etched. Consequently, sharp, well defined uniform edges are imparted to the die elements 12 as etching and removal of material from the die can proceed only from within the die element cavity 18.

The preferred material for film 28 is gold since it is highly resistant to attack by ferric chloride, the most preferred etchant for dies of the variety with which the present invention is involved. After the background and separating cavities are formed but prior to filling these cavities with epoxy, the die is first thoroughly scrubbed with an abrasive such as aluminum oxide (e.g. 240 grit) to remove carbon deposits or other contaminants which might be present at the surfaces of the die. All of the surfaces of the die, save the cutting or working face, are masked and gold is then plated in accordance with conventional procedures to yield a film preferably from about 0.00005 to about 0.00015", and most preferably about 0.0001". The passive film is then removed from those areas where etching is to occur and the die is processed in accordance with the foregoing procedures for chemical milling to yield the sharp cutting edges 20. A particularly preferred method for removing the passive film from the working areas (e.g. those where die elements 12 are to be formed) is by surface grinding the top face of the die, although any other desirable method might be used to achieve this end.

While gold is the most preferred composition for the film underlayment, any material which is passive to the etchant employed might equally well be used to good advantage. For example, platinum might be utilized in lieu of gold. And, even though these are fairly expensive materials, the thin layer employed minimizes the overall cost of using such precious metals. For example, at current prices, a six inch by nine inch die can be electroplated with gold having a value of little more than about $5.00. The metallic films are also preferred for ease of deposition, since the same may be electroplated directly onto the steel substrate. Although plating gold onto steel normally requires an underlying flash of other metal (such as nickel), since the purpose of the plating here is to provide an etchant passive surface and not necessarily an integral permanent bond between the the gold film and the steel substrate, the electroplating procedure need not be as complicated as to require intermediate layers of compatible constituents.

While electroplating is the preferred technique for depositing the metallic film, other techniques might be used. For example, a standard electroless plating process where a solution or paste is applied and then reduced to metallic form might be employed. Likewise, the film might be sputtered onto the die face if that be desirable. Other techniques will occur to those skilled in the art, as well as other suitable compositions for the underlayment.

Regardless of the deposition technique, it is somewhat surprising that such thin films of passive elements such as gold or platinum have the demonstrable, beneficial effects realized by practicing the present invention. For example, were a film of gold to be plated to a thickness of about 0.0001-0.00015" on an open area of a die, that film would not be expected to function in an acceptable manner as a resist film. To the contrary, it would be expected to break down at least locally and fail to provide an efficient, etchant-resistant mask. Nonetheless, as an underlayment film, these materials are found exceedingly beneficial in obtaining high quality precision dies through chemical milling techniques.

When the preferred underlayment film of gold is employed, it not only serves to guard against unwanted etching as aforesaid, the retained gold film is believed to impart better operational characteristics to the die ultimately formed. For example, it is believed that the retained gold film will provide a measure of improved lubricity to the die when used in a subsequent stamping operation. This is an important advantage in providing dies with better stamping characteristics and better longevity.

While the invention has now been described with reference to certain preferred embodiments, those skilled in the art will appreciate the various substitutions, modifications, changes and omissions that may be made without departing from the spirit thereof. Accordingly, it is intended that the scope of the present invention be limited solely by that of the claims granted herein.

What is claimed is:

1. A method for making a die by chemical milling an etchable workpiece to form a pattern of raised die elements separated and bounded by recessed cavities, wherein intermediate stages of fabrication yield recessed cavities filled with etchant-resistant filler, said method comprising the step of depositing an underlayment film of an etchant-resistant composition between the etchable workpiece the etchant-resistant filler.

2. In a method for making a die by chemical milling an etchable workpiece in a series of etching precedures sequentially to yield raised die elements separated and bounded by recessed cavities, wherein at least one etching sequence comprises etching a partially formed workpiece having at least selected ones of said recessed cavities filled with an etchant-resisted filler, the improvement comprising the step of depositing a thin underlayment film of an etchant-resistant composition intermediate the etchable surface of said workpiece and said filler.

3. The method of claims 1 or 2, wherein said underlayment film composition is selected from the group consisting of gold and platinum.

4. The method of claim 3, wherein said film is deposited by electrodeposition.

5. The method of claim 3, wherein said film is deposited by electroplating said composition onto the surface of said workpiece.

6. The method of claim 3, wherein the thickness of said film is from about 0.00005" to about 0.00015".

7. The method of claim 3, wherein the thickness of said film is about 0.0001".

8. A method for chemically milling a steel workpiece by sequential exposure of said workpiece to an etchant to mill selected etchant-active areas thereof and thereby form a plurality of raised die elements separated and bounded by a plurality of recessed cavities, said method comprising the steps of:
   a. initially partially etching a steel workpiece to form raised die element precursors separated and bounded by recessed cavities;
   b. depositing a film of an etchant-resistant composition on said workpiece in at least selected ones of said recessed cavities;

c. filling said at least selected ones of said recessed cavities with an etchant resistant filler; and, d. subsequently etching said workpiece.

9. The method of claim 8, wherein said depositing step comprises electrodepositing said film.

10. The method of claim 9, wherein said depositing step comprises electroplating a film selected from the group consisting of gold and platinum.

11. The method of claim 10, wherein the thickness of said film is about 0.0001".

12. The method of claims 8, 9, 10, or 11, wherein said depositing step comprises depositing said film onto the working face of said workpiece; said method further comprising the step of removing said film from at least selected portions of said die element precursors.

13. The method of claim 12, wherein said removing step comprises the step of surface grinding said workpiece.

14. The method of claim 13, wherein said surface grinding step precedes said filling step.

15. A method for chemically milling a steel workpiece by sequential exposure of said workpiece to an etchant to mill selected etchant-active areas thereof and thereby form a plurality of raised die elements separated and bounded by a plurality of recessed cavities, said method comprising the steps of initially, partially etching a steel workpiece to form raised die element precursors separated and bounded by recessed cavities in the working face thereof; electroplating a gold film having thickness of about 0.0001" onto said working face; surface grinding said working face to remove said film from the surface of said die element precursors; filling said cavities with an epoxy filler; and thence subsequently etching said workpiece.

16. The die made in accordance with claims 1, 2, 8 or 15.

17. The die made in accordance with claim 3.

* * * * *